United States Patent
Shim et al.

(10) Patent No.: US 8,697,475 B2
(45) Date of Patent: Apr. 15, 2014

(54) SOLAR CELL AND METHOD FOR MANUFACTURING THE SAME

(75) Inventors: Goohwan Shim, Seoul (KR); Changseo Park, Seoul (KR); Philwon Yoon, Seoul (KR); Yoonsil Jin, Seoul (KR); Jinsung Kim, Seoul (KR); Youngho Choe, Seoul (KR); Jaewon Chang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/640,713

(22) PCT Filed: Oct. 28, 2010

(86) PCT No.: PCT/KR2010/007460
§ 371 (c)(1),
(2), (4) Date: Oct. 11, 2012

(87) PCT Pub. No.: WO2012/030019
PCT Pub. Date: Mar. 8, 2012

(65) Prior Publication Data
US 2013/0025678 A1      Jan. 31, 2013

(30) Foreign Application Priority Data
Sep. 3, 2010 (KR) .................. 10-2010-0086464

(51) Int. Cl.
*H01L 21/00* (2006.01)

(52) U.S. Cl.
USPC .................. 438/71; 438/72; 257/E21.238

(58) Field of Classification Search
USPC .................. 438/83, 952; 257/E21.532
See application file for complete search history.

(56) References Cited

U.S. PATENT DOCUMENTS

| | | | |
|---|---|---|---|
| 2010/0012185 A1 | 1/2010 | Schmid et al. | |
| 2011/0045631 A1 | 2/2011 | Ji et al. | |
| 2011/0240119 A1 | 10/2011 | Lee et al. | |

FOREIGN PATENT DOCUMENTS

| | | |
|---|---|---|
| JP | 2009-534813 A | 9/2009 |
| KR | 10-2009-0118056 A | 11/2009 |
| KR | 10-2010-0066817 A | 8/2010 |

*Primary Examiner* — Cheung Lee
(74) *Attorney, Agent, or Firm* — Birch, Stewart, Kolasch & Birch, LLP

(57) ABSTRACT

A solar cell and a method for manufacturing the same are disclosed. The solar cell may include a substrate, an emitter layer positioned at a first surface of the substrate, a first anti-reflection layer that is positioned on a surface of the emitter layer and may include a plurality of first contact lines exposing a portion of the emitter layer, a first electrode that is electrically connected to the emitter layer exposed through the plurality of first contact lines and may include a plating layer directly contacting the emitter layer, and a second electrode positioned on a second surface of the substrate.

16 Claims, 5 Drawing Sheets

SOLAR CELL AND METHOD FOR MANUFACTURING THE SAME

TECHNICAL FIELD

Exemplary embodiments of the invention relate to a solar cell and a method for manufacturing the same.

BACKGROUND ART

The solar power generation of converting light energy into electric energy using a photoelectric transformation effect has been widely used as a method for obtaining ecofriendly energy. A solar power generation system using a plurality of solar cell panels has been installed in houses due to improvement of photoelectric transformation efficiency of solar cells.

The solar cell generally includes a substrate and an emitter layer that forms a pn junction along with the substrate, thereby generating a current from light incident on the solar cell through one surface of the substrate.

Because light is generally incident on the solar cell through only one surface of the substrate, current transformation efficiency of the solar cell is low. Accordingly, a doublesided light receiving solar cell, in which light is incident on the solar cell through both surfaces of the substrate, has been recently developed.

FIELD OF THE DISCLOSURE

In one aspect, there is a solar cell including a substrate including a uniform first surface, an emitter layer positioned at a first surface of the substrate, a first antireflection layer positioned on a surface of the emitter layer, the first antireflection layer including a plurality of first contact lines exposing a portion of the emitter layer, a first electrode electrically connected to the emitter layer exposed through the plurality of first contact lines, the first electrode including a plating layer directly contacting the emitter layer, and a second electrode positioned on a second surface of the substrate.

Each of the plurality of first contact lines has a width of about 20 µm to 60 µm, and a plane area of each of the plurality of first contact lines is about 2% to 6% of a plane area of the emitter layer. The first electrode has a thickness of about 20 µm to 50 µm. As a result, the first electrode has a narrow width and a high aspect ratio, for example, an aspect ratio of about 0.83 to 1.

The first surface and the second surface of the substrate may be uniformly textured to form a first textured surface and a second textured surface, respectively.

The first antireflection layer may include a silicon nitride layer and a silicon oxide layer or an aluminum oxide layer positioned between the emitter layer and the silicon nitride layer. The substrate may be formed of an ntype silicon wafer doped with phosphorus (P).

The solar cell may further include a back surface field layer positioned at the second surface of the substrate and a second antireflection layer positioned on a surface of the back surface field layer on which the second electrode is not positioned.

The first electrode and the second electrode may be formed of different materials. For example, a plating layer that may be used to form the first electrode may include a metal seed layer, that directly contacts the emitter layer and contains nickel, and at least one conductive layer, that is positioned on the metal seed layer and contains at least one selected from the group consisting of copper (Cu), silver (Ag), aluminum (Al), tin (Sn), zinc (Zn), indium (In), titanium (Ti), gold (Au), and a combination thereof. The second electrode may be formed of silver (Ag).

A width of the second electrode may be greater than a width of the first electrode. The second antireflection layer may include a silicon nitride layer.

A method for manufacturing the solar cell having the abovedescribed configuration may include texturing the first surface and the second surface of the substrate to form the first textured surface and the second textured surface, respectively, forming the emitter layer at the first surface of the substrate and forming the back surface field layer at the second surface of the substrate, forming the first antireflection layer on the surface of the emitter layer and forming the second antireflection layer on the surface of the back surface field layer, forming the plurality of first contact lines on the first antireflection layer, forming the second electrode on the surface of the second antireflection layer, and forming the first electrode on the plurality of first contact lines, wherein the first electrode and the second electrode are formed of different materials.

The process for forming of the plurality of first contact lines may use a wet etching process or a dry etching process using a laser. More specifically, the forming of the plurality of first contact lines may include etching the first antireflection layer using the dry etching process using the laser and removing a damaged layer of the emitter layer generated by the laser using the wet etching process.

The process for forming the second electrode may include printing a conductive paste obtained by mixing silver (Ag) with a glass frit on the surface of the second antireflection layer and drying and firing the conductive paste. The forming of the first electrode may include forming a metal seed layer directly contacting the emitter layer and forming at least one conductive layer on the metal seed layer.

Further, the second antireflection layer may include a plurality of second contact lines exposing a portion of the back surface field layer. Each of the plurality of second contact lines may have a width of about 40 µm to 100 µm. A plane area of each of the plurality of second contact lines may be about 5% to 15% of a plane area of the back surface field layer.

The second electrode may include a metal seed layer directly contacting the back surface field layer, which is exposed through the plurality of second contact lines, and at least one conductive layer positioned on a surface of the metal seed layer. The first and second electrodes may have the same structure.

For example, the metal seed layer of each of the first and second electrodes may contain nickel. The at least one conductive layer of each of the first and second electrodes may contain at least one selected from the group consisting of copper (Cu), silver (Ag), aluminum (Al), tin (Sn), zinc (Zn), indium (In), titanium (Ti), gold (Au), and a combination thereof.

A method for manufacturing the solar cell having the abovedescribed configuration may include texturing the first surface and the second surface of the substrate to form the first textured surface and the second textured surface, respectively, forming the emitter layer at the front surface of the substrate and forming the back surface field layer at the second surface of the substrate, forming the first antireflection layer on the surface of the emitter layer and forming the second antireflection layer on the surface of the back surface field layer, forming the plurality of first contact lines on the first antireflection layer and forming the plurality of second contact lines on the second antireflection layer, and forming the first electrode on the emitter layer exposed through the plurality of first contact lines and forming the second electrode on the back surface field layer exposed through the plurality of second contact lines, wherein the first electrode and the second electrode are formed of the same material.

The process for forming of the plurality of first and second contact lines may use a wet etching process or a dry etching process using a laser. More specifically, the forming of the plurality of first and second contact lines may include etching the first antireflection layer and the second antireflection layer using a dry etching process using a laser and removing a damaged layer of the emitter layer and a damaged layer of the back surface field layer, that are generated by the laser, using a wet etching process.

The forming of the first and second electrodes may include forming a metal seed layer directly contacting the emitter layer or the back surface field layer and forming at least one conductive layer on the metal seed layer.

In the solar cell having the abovedescribed characteristics, because both the first surface and the second surface of the substrate are the textured surfaces and the first and second antireflection layers serving as passivation layers are respectively positioned on the first surface and the second surface of the substrate, the solar cell may be used to generate a current by allowing light, that is incident on the first surface of the substrate and then is transmitted by the substrate, to be again incident on the second surface of the substrate. Accordingly, the efficiency of the solar cell according to the exemplary embodiment of the invention may increase, as compared to a solar cell generating the current using only light incident on one surface of the substrate.

Further, because the first electrode may be formed using a plating electrode, the width of the first electrode may be less than a width of a related art conductive paste used as an electrode material, and the aspect ratio of the first electrode may increase. Therefore, light incident area may increase, and the efficiency of the solar cell may also increase.

Further, when a surface resistance of the emitter layer increases, contact between the first electrode and the emitter layer may be smoothly maintained.

MODE FOR THE INVENTION

Figure 1:
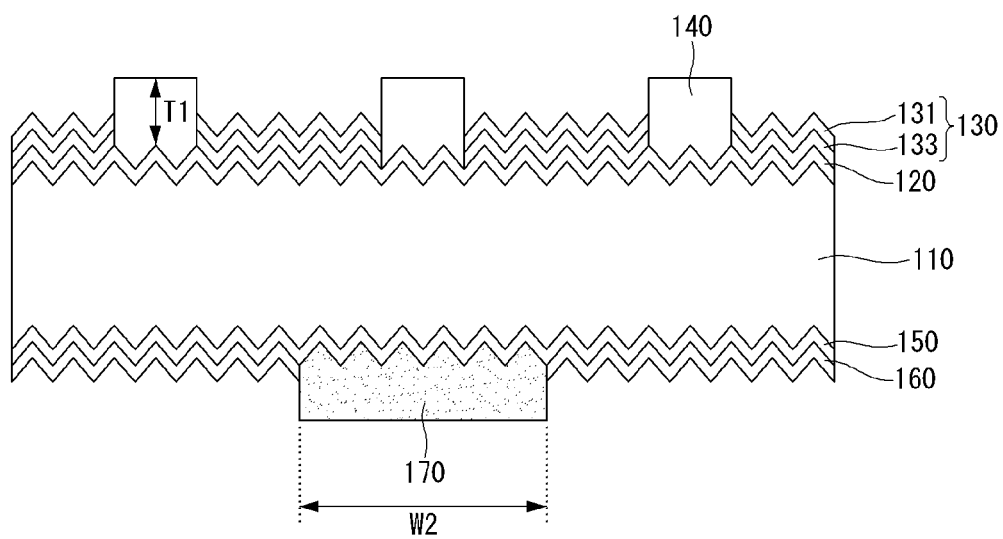
FIG. 1 is a schematic cross-sectional view of a solar cell according to an exemplary embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Likereference numerals designate likeelements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
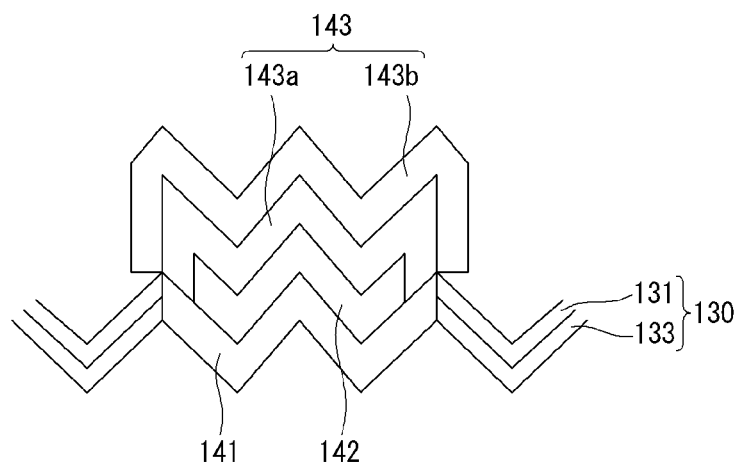
FIG. 2 is an enlarged cross-sectional view of a portion of the solar cell shown in FIG. 1.
Figure 3:
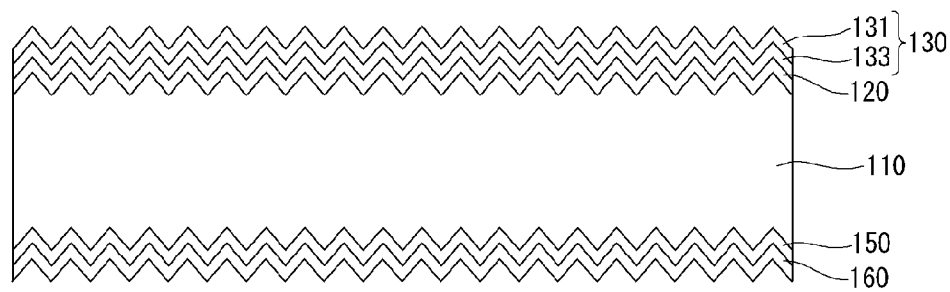
FIGS. 3 to 5 are cross-sectional views sequentially illustrating an exemplary method for manufacturing the solar cell shown in FIG. 1.
Figure 4:
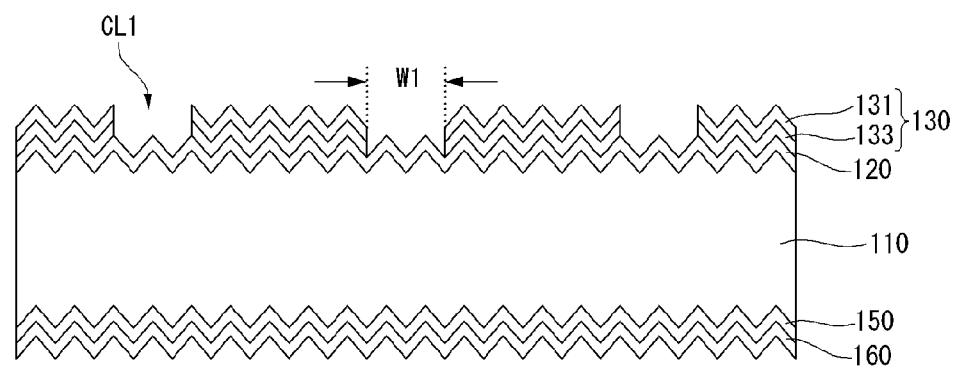
Figure 5:
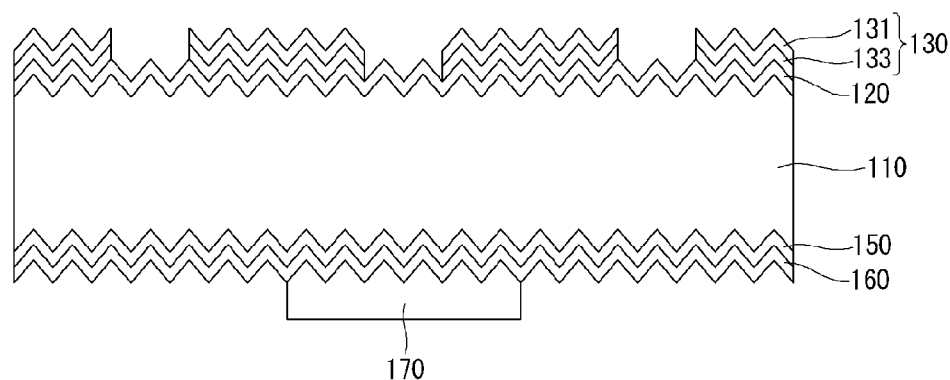
Figure 6:
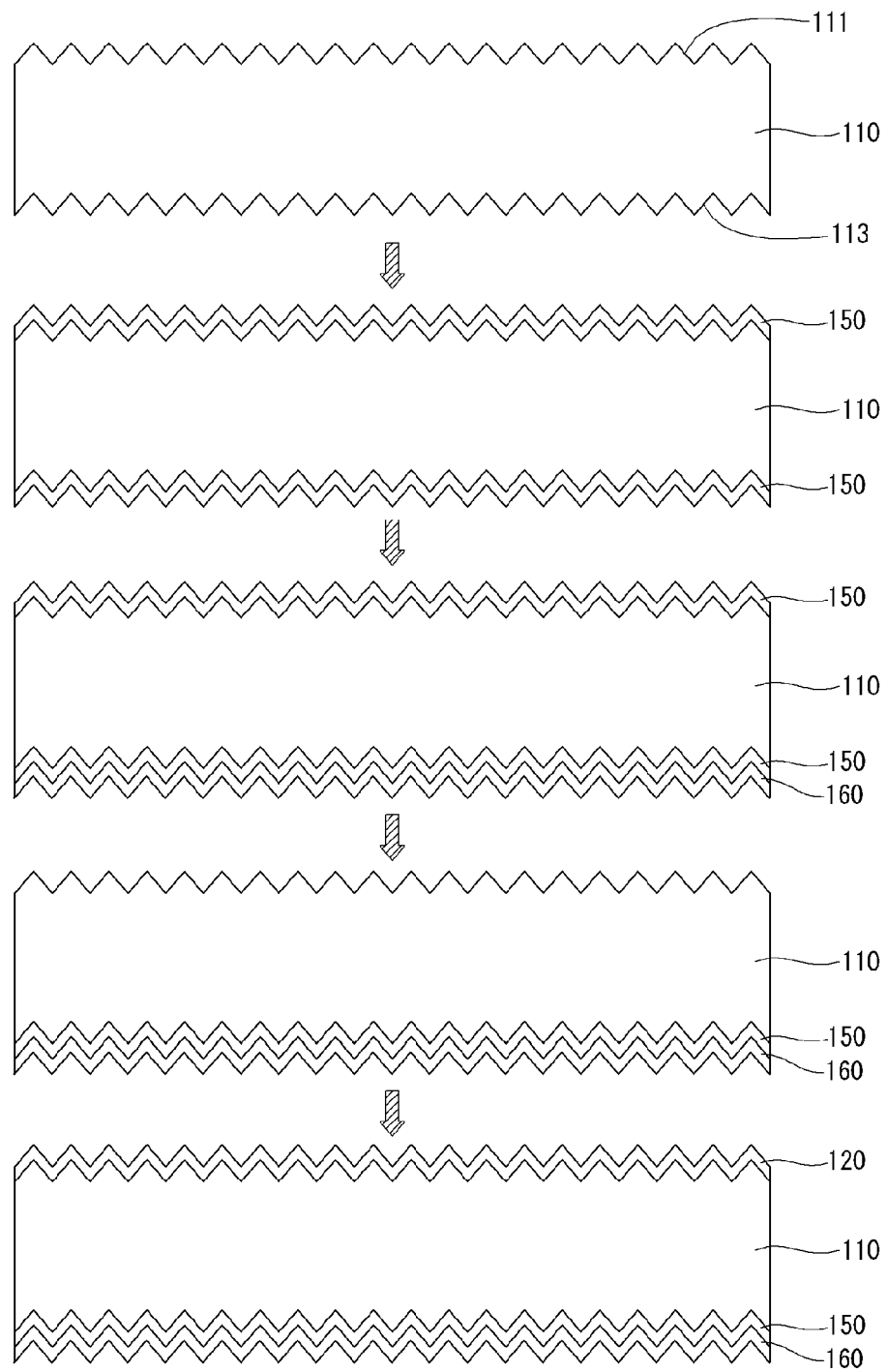
FIG. 6 is a cross-sectional view sequentially illustrating an exemplary method for manufacturing a substrate of the solar cell shown in FIG. 3.

FIG. 1 is a schematic cross-sectional view of a solar cell according to an exemplary embodiment of the invention. FIG. 2 is an enlarged cross-sectional view of a portion of the solar cell shown in FIG. 1. FIGS. 3 to 5 are cross-sectional views sequentially illustrating an exemplary method for manufacturing the solar cell shown in FIG. 1. FIG. 6 is a cross-sectional view sequentially illustrating an exemplary method for manufacturing a substrate of the solar cell shown in FIG. 3.

A solar cell according to an exemplary embodiment of the invention includes a substrate 110, an emitter layer 120 positioned at one surface, for example, a front surface of the substrate 110, a first antireflection layer 130 positioned on the emitter layer 120, a plurality of first electrodes 140 positioned on the emitter layer 120 on which the first antireflection layer 130 is not positioned, a back surface field (BSF) layer 150 positioned at a back surface of the substrate 110, a second antireflection layer 160 positioned on a back surface of the back surface field layer 150, and a plurality of second electrodes 170 positioned on the back surface of the back surface field layer 150 on which the second antireflection layer 160 is not positioned.

The substrate 110 may be formed of a silicon wafer of a first conductive type, for example, an ntype, though not required. Silicon used in the substrate 110 may be crystalline silicon, such as single crystal silicon and polycrystalline silicon, or amorphous silicon. When the substrate 110 is of the ntype, the substrate 110 contains impurities of a group V element such as phosphorus (P), arsenic (As), and antimony (Sb).

Alternatively, the substrate 110 may be of a ptype and/or be formed of other semiconductor materials other than silicon. When the substrate 110 is of the ptype, the substrate 110 may contain impurities of a group III element such as boron (B), gallium (Ga), and indium (In).

As shown in FIG. 6, the surface of the substrate 110 may be uniformly textured to form a textured surface corresponding to an uneven surface or having uneven characteristics. More specifically, the substrate 110 has a first textured surface 111 corresponding to the front surface in which the emitter layer 120 is positioned and a second textured surface 113 corresponding to the back surface at which the back surface field layer 150 is positioned.

The emitter layer 120 positioned at the first textured surface 111 of the substrate 110 is an impurity region of a second conductive type (for example, a ptype) opposite the first conductive type of the substrate 110 and forms a pn junction along with the substrate 110.

A plurality of electronhole pairs produced by light incident on the substrate 110 are separated into electrons and holes by a builtin potential difference resulting from the pn junction between the substrate 110 and the emitter layer 120. The separated electrons move to the ntype semiconductor, and the separated holes move to the ptype semiconductor. When the substrate 110 is of the ntype and the emitter layer 120 is of the ptype, the separated electrons and the separated holes move to the substrate 110 and the emitter layer 120, respectively. Accordingly, the electrons become major carriers in the substrate 110, and the holes become major carriers in the emitter layer 120.

When the emitter layer 120 is of the ptype, the emitter layer 120 may be formed by doping the substrate 110 with impurities of a group III element such as B, Ga, and In.

Alternatively, when the substrate 110 is of the ptype, the emitter layer 120 is of the ntype. In this case, the separated holes move to the substrate 110, and the separated electrons move to the emitter layer 120. When the emitter layer 120 is of the ntype, the emitter layer 120 may be formed by doping the substrate 110 with impurities of a group V element such as P, As, and Sb.

As shown in FIGS. 3-5, the first antireflection layer 130 on the emitter layer 120 in the front surface of the substrate 110 includes a silicon nitride (SiNx:H) layer 131 and an aluminum oxide (AlOx) layer 133 between the emitter layer 120 and the silicon nitride layer 131. The first antireflection layer 130 reduces reflectance of light incident through the front surface of the substrate 110 and increases selectivity of a predetermined wavelength band, thereby increasing the efficiency of the solar cell.

In this embodiment the aluminum oxide layer 133 has a refractive index of about 1.55 to 1.7 and a thickness equal to or less than about 50 nm, and the silicon nitride layer 131 has a refractive index of about 1.9 to 2.3 and a thickness of about 50 nm to 100 nm, so as to minimize the light reflectance in the first antireflection layer 130.

It could be seen from an experiment conducted by the present inventors that the light reflectance in the first antireflection layer 130 was minimized when the first antireflection layer 130 has a doublelayered structure including the silicon nitride layer 131 and the aluminum oxide layer 133, each of which is within the above refractive index and thickness ranges.

A silicon oxide (SiOx:H) layer may be used instead of the aluminum oxide layer 133.

The first antireflection layer 130 may include a plurality of first contact lines CL1 exposing a portion of the emitter layer 120. The first electrodes 140 (see FIG. 1) may be formed on the emitter layer 120 exposed through the first contact lines CL1.

In this embodiment, the first contact line CL1 has a width W1 of about 20 μm to 60 μm, and a plane area of the first contact line CL1 is about 2% to 6% of a plane area of the emitter layer 120, so that the first electrode 140 has a narrow width and a high aspect ratio.

When the first contact line CL1 has the width W1, the first electrode 140 may be formed to have a thickness T1 of about 20 μm to 50 μm using a plating process.

FIG. 1 shows that the thickness T1 of the first electrode 140 indicates a distance from a convex portion of the emitter layer 120 to an upper surface of the first electrode 140. Because a distance from a concave portion to the convex portion of the emitter layer 120 is much shorter than the thickness T1 of the first electrode 140, it does not matter that the thickness T1 of the first electrode 140 is represented by the distance from the convex portion of the emitter layer 120 to the upper surface of the first electrode 140.

According to the abovedescribed structure, the first electrode 140 has a high aspect ratio of about 0.83 to 1.

The first electrodes 140 formed on the emitter layer 120 exposed through the first contact line CL1 are electrically and physically connected to the emitter layer 120. The first electrodes 140 extend substantially parallel to one another in a fixed direction.

The first electrodes 140 collect carriers (for example, holes) moving to the emitter layer 120. In the exemplary embodiment of the invention, the first electrodes 140 may be finger electrodes. Alternatively, each first electrode 140 may be a finger electrode current collector or both a finger electrode and a finger electrode current collector.

As shown in FIG. 2, in the exemplary embodiment of the invention, the first electrode 140 may be formed of a plating layer. The plating layer may include at least one of a metal seed layer 141, a diffusion barrier layer 142, and a conductive layer 143 that may be sequentially formed on the emitter layer 120, if there is more than one layer in the plating layer.

The metal seed layer 141 may be formed of a material containing nickel, for example, nickel silicide (including $Ni_2Si$, NiSi, $NiSi_2$, etc.) and has a thickness of about 50 nm to 200 nm.

When the thickness of the metal seed layer 141 is less than 50 nm, a high resistance is obtained and it is difficult to form a uniform metal seed layer 141. Thus, it is difficult to achieve uniformity in a subsequent process, i.e., in a plating process of the diffusion barrier layer 142. When the thickness of the metal seed layer 141 is greater than 200 nm, the metal seed layer 141 is distributed to silicon at a constant rate in a thermal process to form a nickel silicide layer. Thus, a shunt leakage current may occur because of the distribution of nickel.

The diffusion barrier layer 142 on the metal seed layer 141 prevents junction degradation generated when a formation material of the conductive layer 143 is diffused into a silicon interface through the metal seed layer 141. The diffusion barrier layer 142 includes a nickel layer having a thickness of about 5 μm to 15 μm.

The conductive layer 143 on the diffusion barrier layer 142 is formed of at least one conductive metal material. Examples of the at least one conductive metal material include at least one selected from the group consisting of nickel (Ni), copper (Cu), silver (Ag), aluminum (Al), tin (Sn), zinc (Zn), indium (In), titanium (Ti), gold (Au), and a combination thereof. Other materials may be used.

In the exemplary embodiment of the invention, the conductive layer 143 may include a copper layer 143a. The copper layer 143a substantially serves as an electrical wire and has a thickness of about 10 μm to 30 μm. However, it is known that copper easily oxidizes in the air. Also, it is difficult to directly solder an interconnector, for example, a ribbon (not shown) for electrically connecting the adjacent solar cells to the copper layer 143a in module processing. Thus, when the conductive layer 143 includes the copper layer 143a, the conductive layer 143 may further include a tin layer 143b that prevents oxidization of copper and may be used to smoothly perform a soldering process of the ribbon. The tin layer 143b on the copper layer 143a has a thickness of about 5 μm to 15 μm.

When the conductive layer 143 includes a metal material other than the copper layer 143a, the tin layer 143b may be omitted if the conductive layer does not easily oxidize in the air and can be used to smoothly perform the soldering process of the ribbon.

When the first electrode 140 is a finger electrode, a current collector for collecting carriers moving to the finger electrode may be further formed on the front surface of the substrate 110. The current collector may be formed using a conductive electrode in the same manner as the first electrode 140. Also, the current collector may be formed by printing, drying, and firing a conductive paste containing a conductive material, unlike the first electrode 140.

The second electrodes 170 on the back surface of the substrate 110 collect carriers (for example, electrons) moving to the substrate 110 and output the carriers to an external device. In the exemplary embodiment of the invention, the second electrodes 170 may be finger electrodes. Alternatively, each second electrode 170 may be a finger electrode current collector or both a finger electrode and a finger electrode current collector.

The second electrodes 170 may be formed of at least one conductive material selected from the group consisting of aluminum (Al), nickel (Ni), copper (Cu), silver (Ag), tin (Sn), zinc (Zn), indium (In), titanium (Ti), gold (Au), and a combination thereof. In the exemplary embodiment of the invention, the second electrodes 170 are formed of silver (Ag).

The second electrode 170 may have a width W2 greater than a width of the first electrode 140 (i.e., the width W1 of the first contact line CL1), and a pitch between the second electrodes 170 may be less than a pitch between the first electrodes 140, so that line resistance is reduced. The pitch between the electrodes indicates a distance between the adjacent electrodes.

The back surface field layer 150, electrically and physically connected to the second electrode 170, is positioned at the entire back surface of the substrate 110. The back surface field layer 150 is a region (for example, ntype region) that is more heavily doped than the substrate 110 with the same conductive type impurities as the substrate 110.

The movement of holes to the back surface of the substrate 110 may be prevented or reduced by a potential barrier resulting from a difference between impurity concentrations of the substrate 110 and the back surface field layer 150. Hence, a recombination and/or a disappearance of electrons and holes around the surface of the substrate 110 may be prevented or reduced.

The second antireflection layer 160 may be positioned on the back surface of the back surface field layer 150 on which the second electrodes 170 are not positioned. The second antireflection layer 160 may be formed using a silicon nitride (SiNx: H) layer.

The solar cell having the abovedescribed structure according to the exemplary embodiment of the invention may serve as a doublesided light receiving solar cell, and an operation of the solar cell is described below.

When light irradiated onto the solar cell is incident on the substrate 110 through the emitter layer 120 and/or the back surface field layer 150, a plurality of electronhole pairs are generated in the substrate 110 by the light energy. In this case, because the front surface and the back surface of the substrate 110 may be the first textured surface 111 and the second textured surface 113, respectively, a light reflectance in each of the front surface and the back surface of the substrate 110 is reduced.

Further, because both a light incident operation and a light reflection operation may be performed on each of the first and second textured surfaces 111 and 113 of the substrate 110, light may be confined in the solar cell. Hence, light absorption increases, and the efficiency of the solar cell is improved. In addition, because a reflection loss of the light incident on the substrate 110 may be reduced by the first and second antireflection layers 130 and 160, an amount of light incident on the substrate 110 further increases.

The electronhole pairs are separated into electrons and holes by the pn junction between the substrate 110 and the emitter layer 120, and the separated holes move to the ptype emitter layer 120 and the separated electrons move to the ntype substrate 110. The holes moving to the emitter layer 120 move to the first electrodes 140, and the electrons moving to the substrate 110 move to the second electrodes 170 through the back surface field layer 150. Accordingly, when the first electrodes 140 of one solar cell are connected to the second electrodes 170 of another solar cell adjacent to the one solar cell using electric wires (not shown), current flows through the cells and allows use of the current for electric power.

The solar cell having the abovedescribed configuration may be used in a state where the solar cell is positioned between a light transmission front substrate and a light transmission back substrate and is sealed by a protective layer.

An exemplary method for manufacturing the solar cell having the abovedescribed configuration is described below with reference to FIGS. 3 to 6.

First, as shown in FIG. 6, with reference to FIGS. 3-5, a first uniformly textured surface 111, an emitter layer 120, and a first antireflection layer 130 may be formed at the front surface of the substrate 110. A second textured surface 113, a back surface field layer 150, and a second antireflection layer 160 may be formed at the back surface of the substrate 110.

Referring now to FIG. 6, a substrate 110 formed of the silicon wafer is generally manufactured by slicing a silicon block or an ingot using a blade or a multiwire saw.

More specifically, a silicon wafer is provided and then is doped with impurities of a group V element, for example, phosphorus (P) to form an ntype semiconductor substrate 110.

When the silicon block or the ingot is sliced, a mechanical damage layer may be formed in the silicon wafer. Thus, a wet etching process for removing the mechanical damage layer may be performed, so as to prevent a reduction in characteristics of the solar cell resulting from the mechanical damage layer. An alkaline etchant or an acid etchant may be used in the wet etching process.

After the mechanical damage layer is removed, the wet etching process or a dry plasma etching process may be performed to form the first textured surface 111 in the front surface of the substrate 110 and the second textured surface 113 in the back surface of the substrate 110.

After the first and second textured surfaces 111 and 113 are formed, the back surface field layer 150 may be formed at each of the front surface and the back surface of the substrate 110 by doping each of the front surface and the back surface of the substrate 110 with impurities of a group V element.

The second antireflection layer 160 formed of silicon nitride (SiNx: H) may be formed on the back surface of the back surface field layer 150 at the back surface of the substrate 110.

Subsequently, an etched back process using the second antireflection layer 160 as a mask may be performed on the front surface of the substrate 110 to remove the back surface field layer 150 on the front surface of the substrate 110. The emitter layer 120 may be formed at the front surface of the substrate 110 by doping the front surface of the substrate 110 with impurities of a group III element.

Subsequently, a natural oxide layer may be removed by etching the substrate 110 using hydrofluoric acid (HF), and the first antireflection layer 130 may be formed on the emitter layer 120. The first antireflection layer 130 may be formed by sequentially stacking the aluminum oxide layer 133 and the silicon nitride layer 131. The aluminum oxide layer 133 may serve as a passivation layer as well as an antireflection layer. The aluminum oxide layer 133 may be formed using a plasma enhanced chemical vapor deposition (PECVD) method, a sputtering method, or other methods. A silicon oxide (SiOx) layer may be used instead of the aluminum oxide layer 133. The silicon nitride layer 131 may be formed using the PECVD method, the sputtering method, or other methods in the same manner as the aluminum oxide layer 133.

Next, the wet etching process or a dry etching process using a laser may be performed to remove a portion of the first antireflection layer 130, thereby forming a plurality of first contact lines CL1.

After the plurality of first contact lines CL1 are formed, a conductive paste obtained by mixing silver (Ag) with a glass frit may be printed using an electrode pattern, dried, and fired.

When the conductive paste is fired, a punch through operation is generated because of lead (Pb) contained in the glass frit. Therefore, the second electrode 170 electrically and physically connected to the back surface field layer 150 may be formed.

After the second electrode 170 is formed, the first electrode 140 may be formed using a plating process. A method for forming the first electrode 140 is described below.

The metal seed layer 141 may be formed on the entire surface of the first antireflection layer 130 and on the emitter layer 120 exposed through the first contact line CL1. The metal seed layer 141 may be formed by depositing nickel to a thickness of about 50 nm to 200 nm using a vacuum method, for example, a sputtering method or an electron beam evaporation method and then performing a thermal process at a temperature of about 300° C. to 600° C. in the nitrogen atmosphere.

Alternatively, the metal seed layer 141 may be formed by depositing nickel to a thickness of about 50 nm to 200 nm using an electroless nickel plating process and then performing a thermal process at a temperature of about 300° C. to 600° C. in the nitrogen atmosphere.

According to the abovedescribed process, the metal seed layer 141 formed of nickel silicide (including $Ni_2Si$, NiSi, $NiSi_2$, etc.) is formed.

Next, the diffusion barrier layer 142 and the conductive layer 143 may be sequentially formed on a portion of the metal seed layer 141. More specifically, a barrier layer may be formed on the metal seed layer 141, and an electroplating process is performed on the barrier layer, thereby forming the diffusion barrier layer 142 having a thickness of about 5 µm to 15 µm. A copper layer 143a having a thickness of about 10 µm to 30 µm and a tin layer 143b having a thickness of about 5 µm to 15 µm may be sequentially formed on the diffusion barrier layer 142.

Afterwards, the barrier layer may be removed, and then an etching process using the tin layer 143b as a mask may be performed to remove an exposed area of the metal seed layer 141. Hence, the first electrode 140 is formed.

Figure 8:
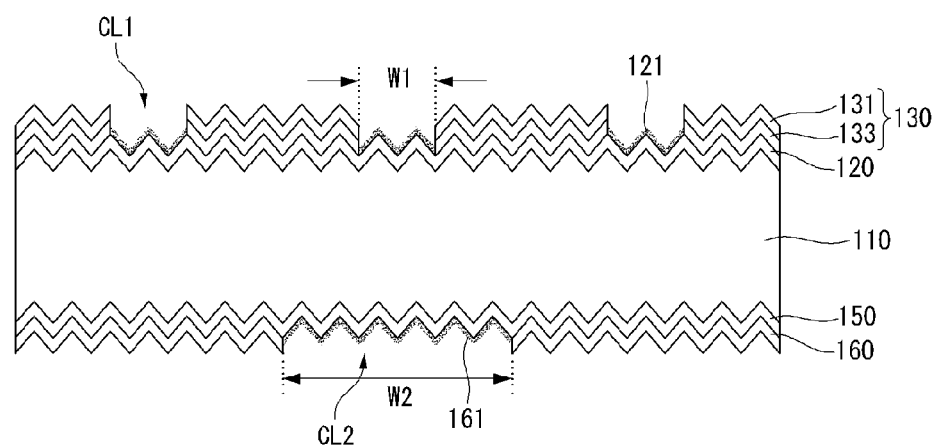
FIGS. 8 and 9 are cross-sectional views sequentially illustrating an exemplary method for manufacturing the solar cell shown in FIG. 7.
Figure 9:
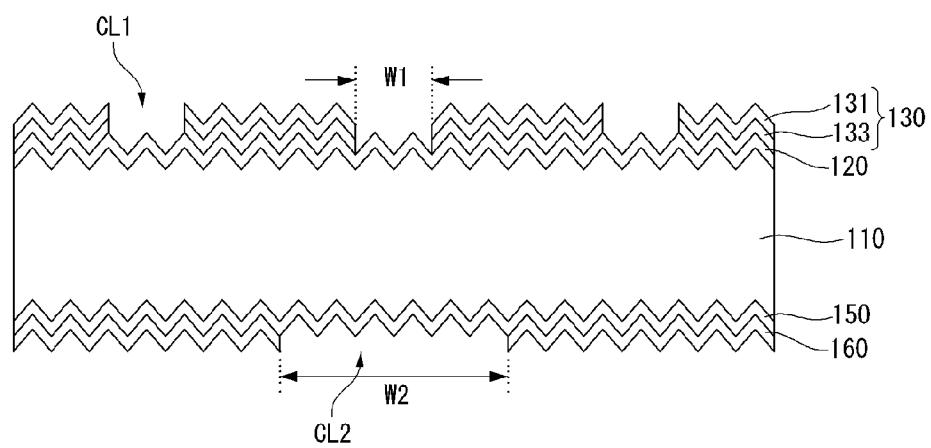

A solar cell according to another exemplary embodiment of the invention is described below with reference to FIGS. 7 to 9.

Figure 7:
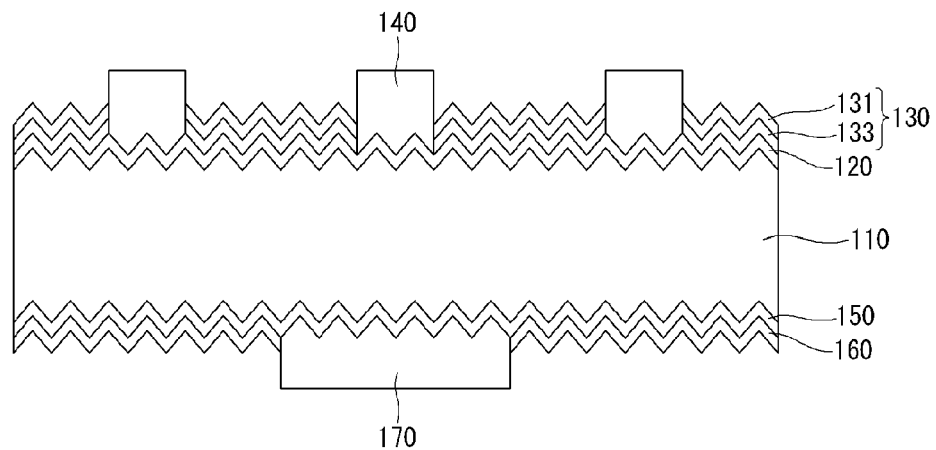
FIG. 7 is a schematic cross-sectional view of a solar cell according to another exemplary embodiment of the invention.

FIG. 7 is a schematic cross-sectional view of a solar cell according to another exemplary embodiment of the invention. FIGS. 8 and 9 are cross-sectional views sequentially illustrating an exemplary method for manufacturing the solar cell shown in FIG. 7.

Since structure in a front surface of a substrate of the solar cell shown in FIG. 7 is substantially the same as the solar cell shown in FIG. 3, a further description may be briefly made or may be entirely omitted and only structure in a back surface of the substrate of the solar cell shown in FIG. 7 is described below.

A back surface field layer 150, a second antireflection layer 160, and a plurality of second electrodes 170 may be positioned at a back surface of a substrate 110.

The second electrodes 170 may be formed using a plating process in the same manner as first electrodes 140 described above.

The second antireflection layer 160 may include a plurality of second contact lines CL2 exposing a portion of the back surface field layer 150, so as to form the second electrodes 170.

The second contact line CL2 may have a width W2 (for example, a width of about 40 µm to 100 µm) greater than a width W1 of a first contact line CL1, a plane area of the second contact line CL2 is about 5% to 15% of a total plane area of the back surface field layer 150, and a pitch between the second electrodes 170 may be less than a pitch between the first electrodes 140, so that a line resistance is reduced.

Although it is not shown in detail, the second electrode 170 formed using the plating process may be formed including at least one of a metal seed layer, a diffusion barrier layer, a copper layer, and a tin layer, that may be sequentially stacked on the back surface field layer 150 exposed through the second contact line CL2, in the same manner as the first electrode 140 described above.

The solar cell having the abovedescribed configuration may be manufactured using the following exemplary method.

A process for respectively forming a first textured surface and a second textured surface on a front surface and a back surface of the substrate, a process for forming an emitter layer at a first textured surface of the front surface of the substrate and forming the back surface field layer at a second textured surface of the back surface of the substrate, and a process for forming a first antireflection layer on a front surface of the emitter layer and forming a second antireflection layer on a back surface of the back surface field layer in an exemplary method for manufacturing the solar cell shown in FIG. 7 are substantially the same as the exemplary method for manufacturing the solar cell shown in FIG. 6. Thus, a description will begin with the subsequent processes.

An emitter layer 120, a first antireflection layer 130, a back surface field layer 150, and a second antireflection layer 160 may be formed at the substrate 110 having first and second textured surface 111 and 113. Then, a plurality of first contact lines CL1 may be formed in the first antireflection layer 130, and a plurality of second contact lines CL2 may be formed in the second antireflection layer 160.

The first contact lines CL1 and the second contact lines CL2 may be formed by performing a wet etching process or a dry etching process using a laser to remove a portion of the first antireflection layer 130 and a portion of the second antireflection layer 160.

When the first contact lines CL1 and the second contact lines CL2 are formed using the dry etching process using the laser, an etching process may be performed using hydrofluoric acid (HF) to remove a damaged portion 121 of the emitter layer 120 and a damaged portion 151 of the back surface field layer 150 that may be damaged by the laser.

After the first and second contact lines CL1 and CL2 are formed, the first electrodes 140 and the second electrodes 170 may be formed using a plating process. A method for forming the first and second electrodes 140 and 170 is described below.

The metal seed layer 141 may be formed on the entire surface of the first antireflection layer 130, the emitter layer 120 exposed through the first contact lines CL1, the entire surface of the second antireflection layer 160, and the back surface field layer 150 exposed through the first contact lines CL1.

The metal seed layer 141 may be formed by depositing nickel to a thickness of about 50 nm to 200 nm using a vacuum method, for example, a sputtering method or an electron beam evaporation method and then performing a thermal process at a temperature of about 300° C. to 600° C. in a nitrogen atmosphere.

Alternatively, the metal seed layer 141 may be formed by depositing nickel to a thickness of about 50 nm to 200 nm using an electroless nickel plating process and then performing a thermal process at a temperature of about 300° C. to 600° C. in a nitrogen atmosphere.

According to the abovedescribed process, the metal seed layer 141 formed of nickel silicide (including $Ni_2Si$, NiSi, $NiSi_2$, etc.) is formed.

Next, a diffusion barrier layer 142 and a conductive layer 143 may be sequentially formed on a portion of the metal seed layer 141. More specifically, a barrier layer may be formed on the metal seed layer 141, and an electroplating process may be performed on the barrier layer, thereby forming the diffusion barrier layer 142 having a thickness of about 5 μm to 15 μm. A copper layer 143a having a thickness of about 10 μm to 30 μm and a tin layer 143b having a thickness of about 5 μm to 15 μm are sequentially formed on the diffusion barrier layer 142.

Afterwards, the barrier layer may be removed, and then an etching process using the tin layer 143b as a mask may be performed to remove an exposed area of the metal seed layer 141. Hence, the first and second electrodes 140 and 170 are formed.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for manufacturing a bifacial solar cell comprising:
    forming an emitter layer and a first anti-reflection layer on a first surface of a substrate and forming a back surface field layer and a second anti-reflection layer on a second surface of the substrate;
    forming a plurality of first contact lines on the first anti-reflection layer and forming a plurality of second contact lines on the second anti-reflection layer, the plurality of first contact lines and the plurality of second contact lines being formed by a dry etching process using a laser; and
    forming a first electrode on the emitter layer exposed through the plurality of first contact lines and forming a second electrode on the back surface field layer exposed through the plurality of second contact lines, the first electrode and the second electrode being formed at the same time,
    wherein the first electrode and the second electrode are formed of the same material.

2. The method of claim 1, further comprising, before the emitter layer and the back surface field layer are formed, texturing the first surface and the second surface of the substrate to form a first textured surface and a second textured surface, respectively.

3. The method of claim 1, wherein the forming of the emitter layer, the first antireflection layer, the back surface field layer and the second anti-reflection layer includes:
    forming the back surface field layer at each of the front surface and the back surface of the substrate;
    forming the second anti-reflection layer on a back surface of the back surface field layer at the back surface of the substrate;
    removing the back surface field layer positioned on the front surface of the substrate;
    forming the emitter layer on the front surface of the substrate; and
    forming the first anti-reflection layer on a front surface of the emitter layer.

4. The method of claim 3, wherein the removing of the back surface field layer uses an etched back process using the second anti-reflection layer as a mask.

5. The method of claim 3, wherein the forming of the first anti-reflection layer includes sequentially stacking an aluminum oxide layer and a silicon nitride layer.

6. The method of claim 1, wherein the forming of the plurality of first and second contact lines further includes
    etching the first anti-reflection layer and the second anti-reflection layer using a dry etching process using a laser; and
    removing a damaged layer of the emitter layer and a damaged layer of the back surface field layer, that are generated by the laser, using a wet etching process.

7. The method of claim 6, further comprising, before the emitter layer and the back surface field layer are formed, texturing the first surface and the second surface of the substrate to form a first textured surface and a second textured surface, respectively.

8. The method of claim 6, wherein the forming of the emitter layer, the first antireflection layer, the back surface field layer and the second anti-reflection layer includes:
    forming the back surface field layer at each of the front surface and the back surface of the substrate;
    forming the second anti-reflection layer on a back surface of the back surface field layer at the back surface of the substrate;
    removing the back surface field layer positioned on the front surface of the substrate;
    forming the emitter layer on the front surface of the substrate; and
    forming the first anti-reflection layer on a front surface of the emitter layer.

9. The method of claim 8, wherein the removing of the back surface field layer uses an etched back process using the second anti-reflection layer as a mask.

10. The method of claim 8, wherein the forming of the first anti-reflection layer includes sequentially stacking an aluminum oxide layer and a silicon nitride layer.

11. The method of claim 1, wherein the forming of the first and second electrodes at the same time includes:
    forming a metal seed layer directly contacting the emitter layer and the back surface field layer; and
    forming at least one conductive layer on the metal seed layer.

12. The method of claim 11, further comprising, before the emitter layer and the back surface field layer are formed, texturing the first surface and the second surface of the substrate to form a first textured surface and a second textured surface, respectively.

13. The method of claim 11, wherein the forming of the emitter layer, the first antireflection layer, the back surface field layer and the second anti-reflection layer includes:
- forming the back surface field layer at each of the front surface and the back surface of the substrate;
- forming the second anti-reflection layer on a back surface of the back surface field layer at the back surface of the substrate;
- removing the back surface field layer positioned on the front surface of the substrate;
- forming the emitter layer on the front surface of the substrate; and
- forming the first anti-reflection layer on a front surface of the emitter layer.

14. The method of claim 13, wherein the removing of the back surface field layer uses an etched back process using the second anti-reflection layer as a mask.

15. The method of claim 13, wherein the forming of the first anti-reflection layer includes sequentially stacking an aluminum oxide layer and a silicon nitride layer.

16. The method of claim 1, wherein the first surface of the substrate is textured.

* * * * *